United States Patent

Sheu et al.

[11] Patent Number: 6,051,469
[45] Date of Patent: Apr. 18, 2000

[54] METHOD OF FABRICATING BIT LINE

[75] Inventors: Yau-Kae Sheu, Hsinchu; Gary Hong, Hsin-Chu, both of Taiwan

[73] Assignee: United Semiconductor Corp., Hsin-chu, Taiwan

[21] Appl. No.: 09/082,660

[22] Filed: May 21, 1998

[30] Foreign Application Priority Data

Apr. 18, 1998 [TW] Taiwan .................................. 87105971

[51] Int. Cl.[7] .................................................. H01L 21/336
[52] U.S. Cl. ............................................................ 438/270
[58] Field of Search ........................... 438/270; 257/330, 257/332

[56] References Cited

U.S. PATENT DOCUMENTS

| | | | |
|---|---|---|---|
| 5,001,525 | 3/1991 | Kenny | 357/23.6 |
| 5,282,158 | 1/1994 | Lee | 365/96 |
| 5,357,132 | 10/1994 | Turner | 257/305 |
| 5,430,673 | 7/1995 | Hong et al. | 365/182 |
| 5,504,357 | 4/1996 | Kim et al. | 257/306 |
| 5,547,889 | 8/1996 | Kim | 437/52 |
| 5,684,313 | 11/1997 | Kenny | 257/296 |
| 5,763,306 | 6/1998 | Tsai | 438/255 |
| 5,981,341 | 11/1999 | Kim et al. | 438/264 |

*Primary Examiner*—Brian Dutton
*Attorney, Agent, or Firm*—Christie, Parker & Hale, LLP

[57] ABSTRACT

A method of fabricating a bit line on a semiconductor substrate is provided. First, an oxide layer is formed and patterned on the substrate. An epitaxial layer is formed on the exposed substrate after patterning the oxide layer. A first spacer and a second spacer are sequentially formed on the sidewalls of a opening of the oxide layer. A trench is formed by partially removing the epitaxial layer and the substrate. A liner oxide layer is formed in the trench after removing the second spacer. A polysilicon layer as a conductive layer is formed in the trench after removing the first spacer. Then, a step of ion implantation and an annealing step are carried out. A buried bit line is formed after etching back the polysilicon layer.

19 Claims, 3 Drawing Sheets

6,051,469

METHOD OF FABRICATING BIT LINE

CROSS-REFERENCE TO RELATED APPLICATION

This application claims the priority benefit of Taiwan application serial no. 87105971, filed Apr. 18, 1998, the full disclosure of which is incorporated herein by reference.

BACKGROUND OF THE INVENTION

1. Field of the Invention

The invention relates in general to the fabrication of semiconductor integrated circuits (ICs), and more particularly to a method for forming a high density integrated circuit device to shorten a distance between bit lines and to decrease the resistance of the bit lines.

2. Description of the Related Art

Certain integrated circuit memory structures consist of array of memory cells positioned at the intersections between an array of parallel buried conducting lines formed in a semiconductor substrate and a perpendicular array of conductive wiring lines formed above the substrate. A prominent example of such memory structures is the type of read only memory (ROM) known as the mask ROM, although other memory structures including EEPROMs might have generally similar configurations. A small portion (four cells) of a mask ROM is illustrated in planar view FIG. 1 and a still smaller portion is illustrated in partial cross section in FIG. 2.

The FIG. 1 mask ROM is formed on a P-type surface of a silicon substrate 10 and includes an array of buried bit lines 12, 14, 16 formed as N-type regions by selective doping of the substrate 10. An array of parallel polysilicon word lines 18, 20 extends over the surface of the substrate 10 in a direction generally perpendicular to the array of bit lines 12, 14, 16. The array of word lines is separated form the substrate by a layer of silicon oxide.

Most often, the ROM of FIG. 1 uses a shared bit line architecture. Thus, bit lines 12, 14, 16 act as source/drain regions for the memory field effect transistor (FETs), word lines 18, 20 act as the gates of the memory transistor, and regions 22, 24, 26, 28 in the substrate under the word lines and between adjacent bit lines act as the channel regions of the memory transistors. Information is stored in the individual memory transistors by altering the transport characteristics of the individual transistors in a manner that can be sensed using the appropriate pair of adjacent bit lines as source/drain contacts for the individual FET. One characteristic of the memory transistor that might be altered to store information is the transistor's threshold voltage. Consequently, the illustrated ROM may be programmed by selecting the threshold voltage of the various memory transistors of the array. The threshold voltages of each of the transistors of the array may be selected by implanting ion impurities through a code mask which ensures that the code implantation reaches only the channels of the FETs that are to have their threshold voltage altered. When programming of the mask ROM is accomplished using the selective implantation of dopants into the channels of the FETs, data stored at the memory locations can be read out by applying an appropriate signal to the particular word line that functions as the gate electrode for the transistor to select a row of memory transistors and then sensing the threshold voltage of the selected FET using the appropriate pair of adjacent bit lines as source/drain contacts for the FET.

FIG. 2 illustrates aspects of the structure of the ROM that are particularly related to the formation of the ROM. Typically, the array of buried bit lines is formed at an early stage in processing by forming an appropriate mask over the substrate and implanting N-type impurities into the substrate to define portions of the substrate that will become the conducting bit lines 12, 14, 16. The implanted substrate is then placed in a high temperature oxidizing environment to activate the bit line implantation and to grow an oxide layer over the surface of the substrate. The oxide layer consists of comparatively thin gate oxide layers 30 over the channel regions 22, 24 and thicker oxide layers 32 over the bit lines 12, 14, 16. Thicker oxide grows over the bit lines 12, 14, 16 because the heavily doped N-type silicon of the bit lines oxidizes at a much faster rate than does the more lightly doped P-type channel regions 22, 24. After the oxide layer is grown, a layer of doped polysilicon is provided over the oxide layer and patterned to define the gate electrodes of the memory transistor, such as the illustrated gate electrode 18. The gate electrodes also function as word lines for the ROM.

As the ROM illustrated in FIGS. 1 and 2 is made smaller, the width of the buried bit lines 12, 14, 16 becomes smaller and the spacing between the bit lines becomes smaller. Smaller bit lines are more restistant and so tend to reduce the speed at which data can be accessed from the ROM. More closely spaced bit lines have an increased likelihood of experiencing punchthrough at normal operating voltages. Punchthrough in FETs occurs when, for a given applied voltage, there are too few carrier in the channel region to maintain a distinct channel in the FET and the depletion region associated with the source and the drain regions extends completely across the channel. For a FET after the onset of punchthrough, application of signals to the gate electrode effects little or no control on the FET. Punchthrough limits the maximum voltage that can be applied to short channel FETs and also limits how small a channel region can be made for certain combinations of source/drain and channel doping levels. As a practical matter, punchthrough limits how small memory transistors can be made in a high volume manufacturing environment.

SUMMARY OF THE INVENTION

It is therefore desirable to produce a buried bit line structure more compatible with smaller device geometries so that reduced design rules do not result in unacceptable memory performance and punchthrough.

It is the object of the invention to provide a method of forming a bit line. An oxide layer is formed and patterned on a semiconductor substrate. An epitaxial layer is formed on the exposed semiconductor substrate. A first spacer and a second spacer are sequentially formed on the sidewalls of the oxide layer. The epitaxial layer and the semiconductor substrate are partially removed to form a trench in the semiconductor substrate by using the first spacer and the second spacer as a mask. A liner oxide layer is formed on the inner-surface of the trench after removing the second spacer. A polysilicon layer as a conductive layer is formed on the liner oxide layer to fill the trench. A photolithography and etching step is performed at the conductive layer. A buried bit line is formed after etching back the conductive layer until the oxide layer is exposed.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
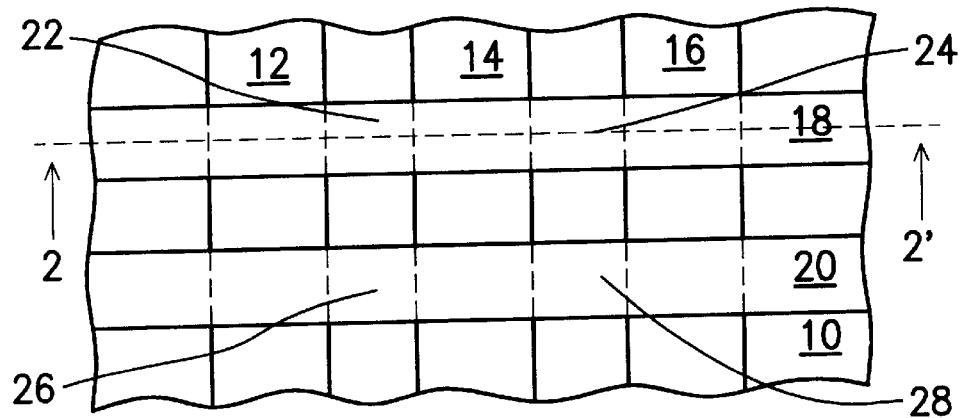
FIG. 1 is a planar view of a small portion of a conventional mask ROM.
Figure 2:
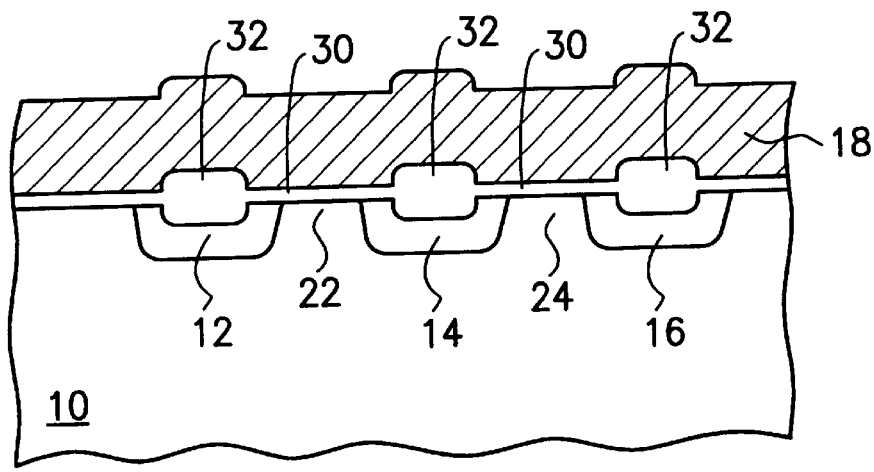
FIG. 2 is a cross-sectional view through a portion of the FIG. 1 mask ROM.
Figure 3A:
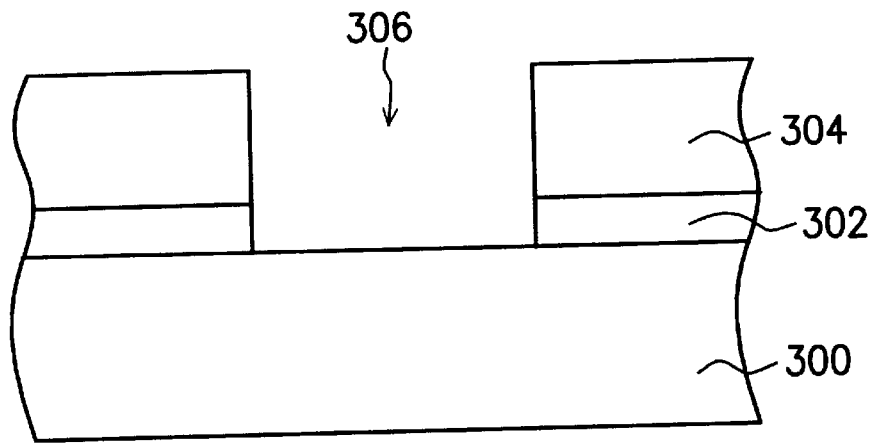
FIGS. 3A–3E illustrate steps in the formation of a bit line in accordance with preferred embodiment of the present invention.

Referring first to FIG. 3A, a semiconductor substrate 300 (for example a silicon substrate) is provided. An oxide layer 302 is formed, for example, by thermal oxidation on the substrate 300. The oxide layer 302 has a thickness of about 2000–4000 Å. After this, a photoresist layer 304 is provided on the oxide layer 302. A photolithography and etching step is performed to pattern a bit line. The oxide layer 302 is etched to form an opening 306 and expose part of the substrate 300.

Figure 3B:
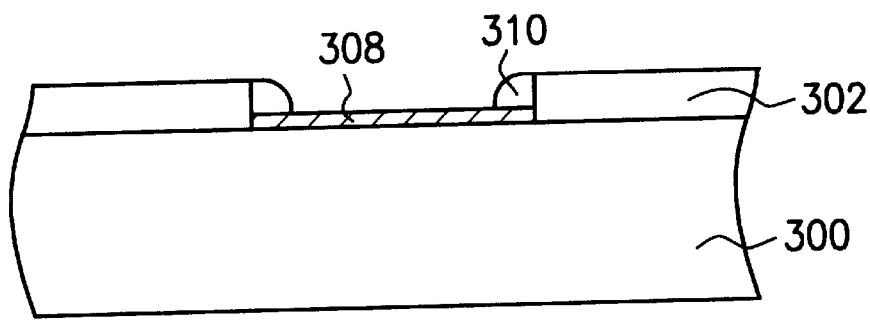

Next, as shown in FIG. 3B, the photoresist layer 304 is removed after etching the oxide layer 302. An epitaxial layer 308 is formed, for example, by alternate deposition on the exposed substrate 300. The epitaxial layer 308 is only deposited on the surface of the silicon substrate 300 and not on the oxide layer in alternate deposition. The epitaxial layer 308 has a thickness of about 200–500 Å. A first spacer 310 is formed on the idewalls of the opening 306 after the epitaxial layer 308 is formed. The steps to form the first spacer 310 are, for example, forming a silicon nitride layer on the structure described above and then etching back to form the first spacer 310.

Figure 3C:
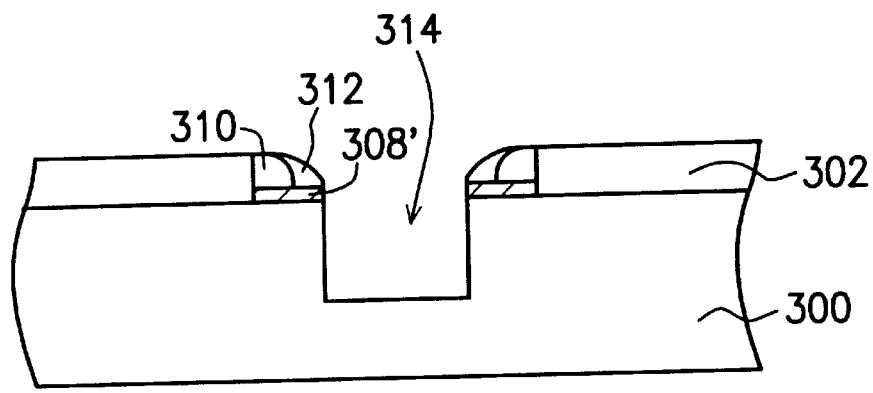

Referring to FIG. 3C, a second spacer 312, a silicon dioxide layer, is formed adjacent the first spacer 310. The material of the second spacer 312 is, for example, silicon dioxide formed by thermal oxidation. The epitaxial layer 308 and the substrate 300 are partially removed after forming the second spacer 312 to form a trench 314 in the substrate 300. The trench 314 is formed, for example, by alternateetching and has a thickness of about 0.4–0.8 μm. The second spacer 312 provides an etching stop effect during the etching step to form the trench 314. It allows the epitaxial layer 308' under the second spacer 312 and the first spacer 310 to remain in the etching step.

Figure 3D:
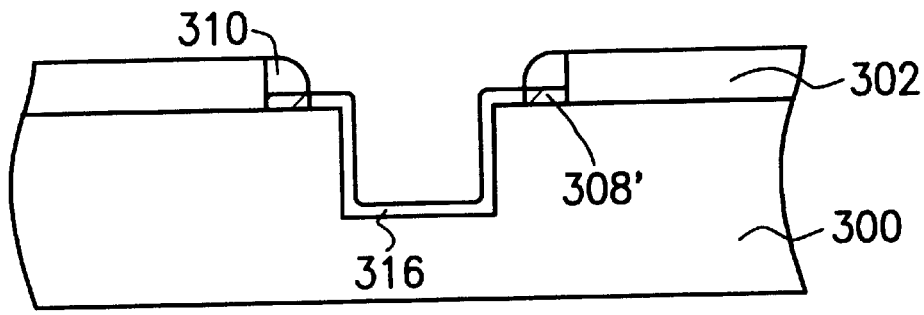

Next, referring to FIG. 3D, the second spacer 312 is removed after forming the trench 314. A liner oxide layer 316 is formed, for example, by thermal oxidation in the trench 314 and has a thickness of about 300–500 Å. The first spacer 310 is used to protect the reserved epitaxial layer 308' under the first spacer 310 from oxidizing during the oxidation process.

Figure 3E:
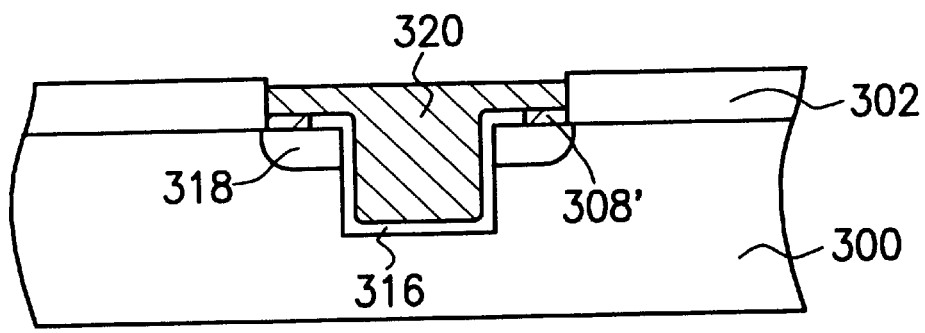

Referring to FIG. 3E, the first spacer 310 is removed and a conductive layer is formed on the foregoing structure. The material of the conductive layer is, for example, polysilicon. The conductive layer has a thickness of about 2000–4000 Å (not shown). After this, an ion implantation step is carried out to dope an impurity, for example, arsenic (As) into the conductive layer. Then, the structure described above is annealed. The annealing step makes the impurity penetrate through the reserved epitaxial layer 308' and form an $N^+$ junction region 318 in the substrate 300. After this, the conductive layer is etched back to expose the oxide layer and to form a conductive bit line 320 in the trench 314.

Since the junction region is formed by diffusion, the depth and the uniformity of the junction region are easily controlled. A shallow junction can be formed by controlling the doping concentration and by annealing. Furthermore, the bit line using a material such as polysilicon can have a low resistance and enhance the effect of semiconductor structures.

One feature of the invention is to provide a method of fabricating a bit line. The bit line with a lower resistance is formed from a material such as polysilicon. The epitaxial layer between the bit line and the substrate proves a junction region. It give the buried bit line a lighter concentration at the junction region adjoining the channel to prevent punch-through.

The other feature of the invention is using the first spacer and the second spacer to protect the lower epitaxial layer. Moreover, the second spacer serves as an etching stop to allow some of the epitaxial layer to remain during trench formation. The first spacer prevents the epitaxial layer from oxidizing in the step forming the liner oxide layer.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a bit line, comprising the steps of:

providing a semiconductor substrate;

forming an oxide layer on the semiconductor substrate, wherein the oxide layer has a opening which exposes part of the semiconductor substrate;

forming an epitaxial layer on the exposed semiconductor substrate;

forming a first spacer on the sidewalls of the opening of the oxide layer;

forming a second spacer adjoining the first spacer;

partially removing the epitaxial layer and the semiconductor substrate to form a trench in the semiconductor substrate;

removing the second spacer;

forming a liner oxide layer in the trench;

removing the first spacer;

forming a conductive layer on the oxide layer and in the trench;

performing a step of ion implantation and annealing; and etching back the conductive layer to expose the oxide layer.

2. A method according to claim 1, wherein the oxide layer has a thickness of about 2000–4000 Å.

3. The method according to claim 1, wherein the epitaxial layer has a thickness of about 200–500 Å.

4. The method according to claim 1, wherein the material of the first spacer is silicon nitride.

5. The method according to claim 1, wherein the material of the second spacer is silicon dioxide.

6. The method according to claim 1, wherein the liner oxide layer has a thickness of about 300–500 Å.

7. The method according to claim 1, wherein the material of the conductive layer is polysilicon.

8. The method according to claim 7, wherein the conductive layer has a thickness of about 2000–4000 Å.

9. The method according to claim 1, wherein the step of ion implantation is carried out with arsenic ions.

10. The method according to claim 9, wherein the concentration of arsenic ions is about $10^{15}$–$10^{16}$ ion/cm$^2$.

11. A method of fabricating bit line, comprising the steps of:

providing a semiconductor substrate;

forming a oxide layer on the semiconductor substrate, wherein the oxide layer has an opening which exposes part of the semiconductor substrate;

forming an epitaxial layer on the exposed semiconductor substrate;

forming a silicon nitride spacer on the sidewalls of the opening of the oxide layer;

forming an oxide spacer adjoining the first spacer;

partially removing the epitaxial layer and the semiconductor substrate to form a trench in the semiconductor substrate;

removing the oxide spacer;

forming a liner oxide layer in the trench;

removing the silicon nitride spacer;

forming a polysilicon layer on the oxide layer and in the trench;

doping an impurity into the polysilicon layer and annealing; and etching back the polysilicon layer to expose the oxide layer.

12. The method according to claim 11, wherein the oxide layer is formed by thermal oxidation.

13. The method according to claim 11, wherein the oxide layer has a thickness of about 2000–4000 Å.

14. The method according to claim 11, wherein the epitaxial layer has a thickness of about 200–500 Å.

15. The method according to claim 11, wherein the oxide spacer is formed by thermal oxidation.

16. The method according to claim 11, wherein the liner oxide layer has a thickness of about 200–500 Å.

17. The method according to claim 11, wherein the polysilicon layer has a thickness of about 2000–4000 Å.

18. The method according to claim 11, wherein the impurity is arsenic ions.

19. The method according to claim 18, wherein the concentration of arsenic ions is about $10^{15}$~$10^{16}$ ion/cm$^2$.

* * * * *